United States Patent
Wee et al.

(10) Patent No.: US 9,426,919 B2
(45) Date of Patent: Aug. 23, 2016

(54) ELECTRONIC DEVICE

(71) Applicant: Samsung Electronics Co., Ltd., Gyeonggi-do (KR)

(72) Inventors: Jong-Cheon Wee, Gyeonggi-do (KR); Sung-Ill Kang, Gyeongsangbuk-do (KR); Jun-Woo Park, Gyeonggi-do (KR); Chang-Seok Bae, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 130 days.

(21) Appl. No.: 14/035,089

(22) Filed: Sep. 24, 2013

(65) Prior Publication Data

US 2014/0104795 A1    Apr. 17, 2014

(30) Foreign Application Priority Data

Oct. 11, 2012   (KR) .......................... 10-2012-0113050

(51) Int. Cl.
| | |
|---|---|
| *H05K 7/14* | (2006.01) |
| *H05K 5/02* | (2006.01) |
| *G06F 1/18* | (2006.01) |
| *G06F 1/16* | (2006.01) |
| *H01R 13/52* | (2006.01) |

(52) U.S. Cl.
CPC ........ *H05K 7/14* (2013.01); *G06F 1/183* (2013.01); *H05K 5/0247* (2013.01); *G06F 1/1656* (2013.01); *H01R 13/52* (2013.01)

(58) Field of Classification Search
CPC ............... H01R 13/52; H01R 13/5202; H01R 13/5205; H01R 13/5221; H01R 12/79; H01R 13/5219; H05K 7/14; H05K 5/0247; H05K 7/1428; H05K 5/061; H05K 5/064; H05K 5/065; G06F 1/183; G06F 1/1656
USPC ............ 361/752, 679.4, 679.5; 439/271, 587, 439/79

See application file for complete search history.

(56) References Cited

U.S. PATENT DOCUMENTS

| | | | | |
|---|---|---|---|---|
| 5,701,355 | A * | 12/1997 | Brannan et al. ............... | 381/361 |
| 7,083,439 | B1 * | 8/2006 | Hayakawa et al. ........... | 439/136 |
| 7,922,535 | B1 * | 4/2011 | Jiang et al. ............... | 439/607.35 |
| 8,011,956 | B1 * | 9/2011 | Yang et al. .................... | 439/589 |
| 8,292,662 | B2 * | 10/2012 | Yang et al. .................... | 439/587 |
| 8,840,423 | B2 * | 9/2014 | Hoshi et al. .................. | 439/374 |
| 2009/0142969 | A1 * | 6/2009 | Chuang ......................... | 439/709 |
| 2009/0253027 | A1 * | 10/2009 | Yang et al. ...................... | 429/61 |
| 2010/0259891 | A1 * | 10/2010 | Tachikawa ............... | 361/679.55 |
| 2010/0313485 | A1 * | 12/2010 | Kuo ............................. | 49/484.1 |
| 2012/0190228 | A1 * | 7/2012 | Lee .............................. | 439/271 |
| 2013/0065442 | A1 * | 3/2013 | Nagata ............... | H01R 13/5202 439/607.58 |
| 2013/0330951 | A1 * | 12/2013 | Yudate ......................... | 439/271 |

\* cited by examiner

*Primary Examiner* — Adrian S Wilson
*Assistant Examiner* — Abhishek Rathod
(74) *Attorney, Agent, or Firm* — Cha & Reiter, LLC

(57) ABSTRACT

An electronic device is provided. The electronic device includes a mainboard, a housing, and a sealing member. The mainboard surface-mounts a socket connector thereon. The housing receives the mainboard and forms a through hole. The sealing member defines a space for receiving the socket connector via coupling with the mainboard and allows the space and the through hole of the housing to communicate with each other.

9 Claims, 6 Drawing Sheets

ELECTRONIC DEVICE

CROSS RELATED APPLICATION

This application claims the benefit under 35 U.S.C. §119 (a) from a Korean patent application filed in the Korean Intellectual Property Office on Oct. 11, 2012 and assigned Serial No. 10-2012-0113050, the entire disclosure of which is hereby incorporated by reference in its entirety.

BACKGROUND

1. Field of the Invention

The present disclosure relates to a sealing unit of an electronic device. More particularly, the present invention relates to an apparatus for preventing water from leaking to the inside of the electronic device via an external connector.

2. Description of the Related Art

Currently, as an electronic communication industry develops, electronic devices such as mobile phones, Personal Digital Assistants (PDA), digital Televisions (TV), etc. have become a necessity of a modern life, serving as an important means for transferring and exchanging information quickly between parties.

Generally, an electronic device will also include a socket connector for connection with an external device thereon. The external device forms a plug connector fit within this socket connector. The socket connector of the electronic device is adapted to receive the plug connector and the plug connector of the external device are electrically connected, so that the electronic device can transmit/receive a signals to/from the external device.

FIG. 1A is an exploded perspective view illustrating the structure of a socket connector in the conventional electronic device, and FIG. 1B is a crucial cross-sectional view illustrating an assembled socket connector of the conventional electronic device.

Referring to FIG. 1A, a mainboard 1 is fixed to a housing 2 forming a singular unit. The mainboard 1 surface-mounts a socket connector 11 thereon. The housing 2 has a shape that is adapted to receive and can safely and securely seat the mainboard 1 within the housing. The socket connector 11 has an open aperture forming a receiver 12 for allowing a plug connector of an external device to be fit therein. The housing 2 has a hole 21 for receiving the socket connector 11 and exposing the receiver 12 of the socket connector 11 externally to the housing.

Referring to FIG. 1B, where a cross-sectional view illustrating an assembled socket connector of the conventional electronic device is depicted, the housing 2 is adapted to receive and can safely and securely seat the mainboard 1 therein, and the socket connector 11 is received in the housing 2. In the case where the electronic device floods or is immersed in a liquid such as water, the water flows through the receiver 12 of the socket connector 11 via the hole 21 of the housing 2, and water leaks to the inside of the electronic device via gaps 31 and 32 between the housing 2 and the mainboard 1.

Consequently, the structure of the socket connector in the conventional electronic device is vulnerable to infiltration of water and liquids, as it does not provide a waterproof structure.

SUMMARY

An aspect of the present invention is to address at least some of the above-mentioned problems and/or disadvantages and to provide at least the advantages described below. Accordingly, an aspect of the present invention is to provide a sealing unit for preventing water from leaking to the inside of an electronic device.

Another aspect of the present invention is to provide a sealing unit for preventing water from leaking to the inside of an electronic device via a socket connector of the electronic device.

Still another aspect of the present invention is to provide a sealing unit for preventing water from leaking to the inside of an electronic device by sealing gaps between a mainboard of the electronic device and a housing fixing the mainboard and forming a singular unit.

Yet another aspect of the present invention is to provide an electronic device having a sealing unit for providing a waterproof function and capability in the event of flooding.

Therefore in accordance with the aspects of the present invention, there is provided an electronic device. The electronic device includes a mainboard that surface-mounts a socket connector thereon, a housing for receiving the mainboard, where the housing includes a through hole, and a sealing member for defining a space for receiving the socket connector when coupled with the mainboard and wherein the sealing member is in alignment with and allows the space and the through hole of the housing to communicate with each other.

In accordance with the aspect of the present invention, the sealing member forms a body of a container shape having an open upper portion and an open front portion, the open upper portion of the body is closely attached to the mainboard, and the open front portion of the body is closely attached to the housing in alignment with the housing.

In accordance with the aspect of the present invention, the sealing member includes an upper leakage prevention member disposed on a periphery of the open upper portion of the body and interposed between the body and the mainboard, and a front leakage prevention member disposed on a periphery of the open front portion of the body and interposed between the body and a periphery of the through hole of the housing.

In accordance with the aspect of the present invention, the upper leakage prevention member and the front leakage prevention member include at least one of urethane and rubber.

In accordance with the aspect of the present invention, the upper leakage prevention member and the front leakage prevention member of the sealing member are formed on the body via double injection molding.

In accordance with an exemplary aspect of the present invention, the sealing member includes a connector vertically extending from the body and securely affixed to the mainboard.

In accordance with the aspect of the present invention, the connector of the sealing member forms a hook securely affixed to the mainboard at its end, and the mainboard forms a hook fasten hole for receiving and retaining the hook of the connector of the sealing member.

In accordance with the aspect of the present invention, the sealing member includes a connector horizontally extending from the body, forming a boss for receiving a screw coupling, and securely affixing the sealing member to the mainboard.

In accordance with the aspect of the present invention, the mainboard forms a boss fasten hole corresponding to and in alignment with the boss of the connector of the sealing member, and the housing forms a boss in alignment with the boss fasten hole of the mainboard and the boss of the connector and wherein the housing is screw-coupled to the boss of the sealing member and the mainboard.

In accordance with the aspect of the present invention, the mainboard forms a plurality of boss fasten holes, and the housing forms a plurality of bosses coupled to a screw that are in alignment with and pass through the boss fasten hole of the mainboard.

In accordance with the aspect of the present invention, the housing includes an upper housing and a lower housing defining a confined space for receiving a plurality of parts via coupling with the upper housing.

In accordance with the aspect of the present invention, the socket connector forms a receiver for receiving and electrically connecting to a plug connector of an external device inserted via the through hole of the housing, and where the socket connector is disposed on a periphery of the mainboard.

In accordance with an aspect of the present invention, the socket connector is adapted to receive a used for a Universal Serial Bus (USB) plug connector.

In accordance with another aspect of the present invention, an electronic device is provided. The electronic device includes a mainboard that surface-mounts a socket connector thereon, a housing having an outside and an inside space for receiving the mainboard and forming a through hole for allowing the socket connecter to communicate with the outside, a body for defining a space for receiving the socket connector via coupling with the mainboard where the space is aligned and adapted to communicate with the through hole of the housing, and at least one leakage prevention member interposed between the body and at lest one of the mainboard and the housing for sealing the space.

In accordance with another aspect of the present invention, the leakage prevention member is interposed and forms a seal between a portion where the body and the mainboard are closely attached and a portion where the body and the through hole of the housing are closely attached.

In accordance with another aspect of the present invention, the body has a container shape with an open upper portion and an open front portion are open, the open upper portion of the body is closely attached to the mainboard, and the open front portion of the body is closely attached to the through hole of the housing.

In accordance with another aspect of the present invention, the leakage prevention member is disposed on a periphery of the open upper portion of the body and a periphery of the open front portion of the body.

In accordance with another aspect of the present invention, the body includes: a first connection member forming a hook vertically extending from the body and securely affixed to the mainboard at its end, and a second connection member forming a boss horizontally extending from the body for receiving a screw-coupling and securely affixing the body to the mainboard.

In accordance with another aspect of the present invention, the mainboard forms a hook fasten hole in alignment with and adapted to receive the hook for securely affixing the hook of the first connection member, wherein the mainboard further includes a boss fasten hole in alignment with and corresponding to the boss of the second connection member and adapted to receive a screw-coupling to securely affix the mainboard to the body.

In accordance with another aspect of the present invention, the housing includes: an upper housing forming a boss that is in alignment with the boss fasten hole of the mainboard and the boss of the second connection member; and a lower housing forming a through hole which is in alignment with the boss of the second connection member and the boss of the upper housing, the through hole adapted to receive a screw coupling for coupling the lower housing with the body and with the upper housing.

In accordance with another aspect of the present invention, the housing includes: an upper housing and a lower housing for preparing a space for receiving a plurality of parts via coupling with the upper housing.

In accordance with another aspect of the present invention, the socket connector has a receiver for receiving a plug connector of an external device and is disposed on a periphery of the mainboard.

In accordance with another aspect of the present invention, the leakage prevention member includes at least one of urethane and rubber formed on the body via double injection.

In accordance with further another aspect of the present invention, an electronic device is provided. The electronic device includes an upper housing, a lower housing vertically disposed under the upper housing, preparing a space for receiving a plurality of parts via coupling with the upper housing, and forming a through hole in a side portion thereof, a mainboard, a socket connector mounted on a lower side of the mainboard, forming a receiver for receiving a plug connector of an external device inserted via the through hole of the housing, and disposed on a periphery of the mainboard, and a sealing member fixed on the lower side of the mainboard, preparing a space for receiving the socket connector via coupling with the mainboard, and allowing the space to communicate with the through hole of the housing, wherein the sealing member forms an open upper portion closely attached to the lower side of the mainboard with an upper leakage prevention member interposed, and an open front portion closely attached on a periphery of the through hole of the housing with the a front leakage prevention member interposed, and communicates with the through hole of the housing.

The conventional electronic device has a structure under which water easily leaks to the inside via a socket connector. In contrast, a sealing unit according to the present invention can prevent water from leaking to the inside of the electronic device via a socket connector of the electronic device.

Other aspects, advantages and salient features of the ELECTRONIC DEVICE in accordance with the present invention will become apparent to a person of ordinary skill in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings in which.

Throughout the drawings, like reference numerals will be understood to refer to like parts, components and structures.

DETAILED DESCRIPTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, in the following description, well-known functions or constructions may not be described in detail when they would obscure appreciation of the present invention by a person of ordinary skill in the art with unnecessary detail of the well-known functions and structures. Also, the terms used herein are defined according to the functions of the present invention as would be understood by a person of ordinary skill in the art. Thus, the terms may vary depending on user's or operator's intension and usage. That is, the terms used herein must be understood based on the descriptions made herein in view of the ordinary level of skill in the art.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

Figure 1A:
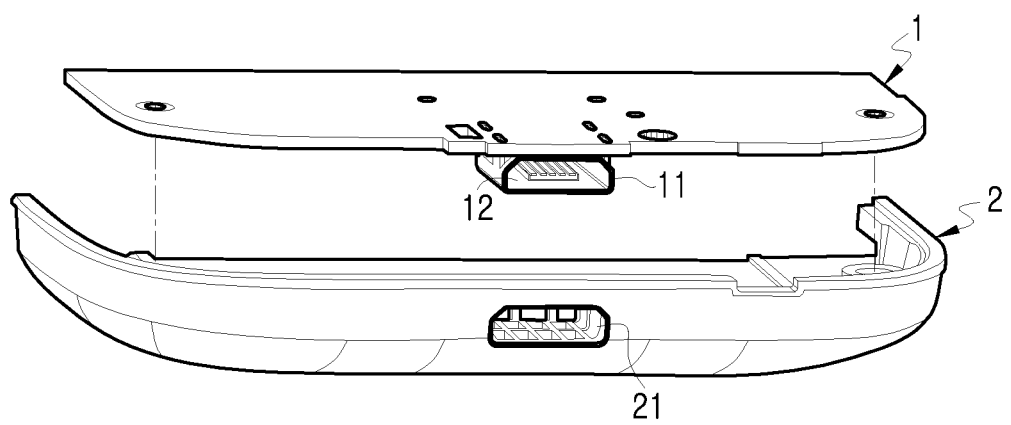
FIG. 1A is a exploded perspective view illustrating the structure of a socket connector in the conventional electronic device.
Figure 1B:
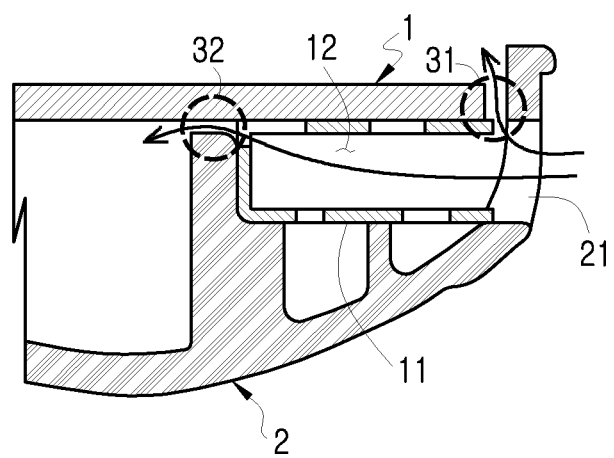
FIG. 1B is a cross-sectional view illustrating an assembled socket connector of the conventional electronic device.
Figure 2:
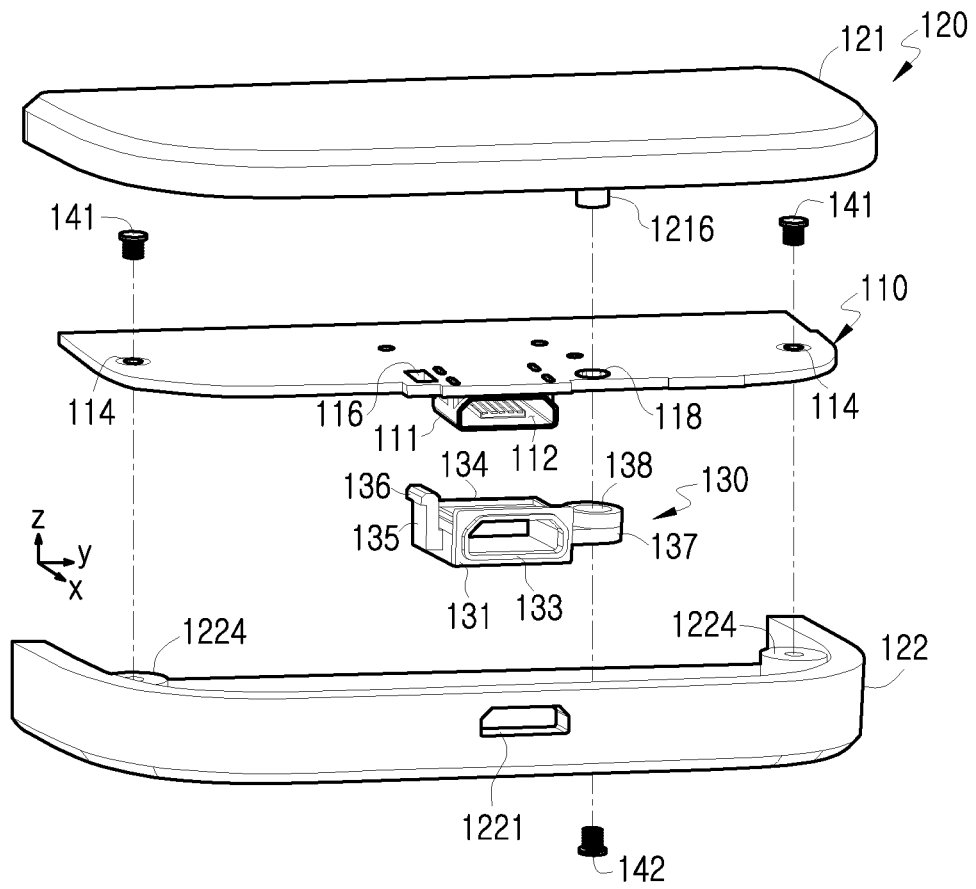
FIG. 2 is a exploded perspective view illustrating the assembled structure of a socket connector in an electronic device according to an exemplary embodiment of the present invention.

FIG. 2 is a exploded perspective view illustrating the assembled structure of a socket connector in an electronic device according to an embodiment of the present invention.

Referring to FIG. 2, a mainboard 110 is fixed to a housing 120 forming an singular unit.

The housing 120 includes an upper housing 121 and a lower housing 122. The upper housing 121 and the lower housing 122 couple to each other to form a hollow space for receiving parts therein. The mainboard 110 is received within this space.

The mainboard 110 surface-mounts a socket connector 111 on its lower side, and the housing 120 has a shape adapted to receive and securely seat the mainboard 110. The mainboard 110 is a substrate containing a basic circuit and parts, and includes circuits and parts for setting an execution and operating environment of a terminal, storing data and maintaining information thereof Additionally the circuit and parts allow a mobile terminal to be stably driven, and allows data input/output exchange of all components and devices of the mobile terminal and devices attached to the mobile terminal.

The socket connector 111 has a receiver 112 adapted for receiving a plug connector of an external device. The socket connector 111 is disposed on the periphery of the mainboard 110 so that the open portion of the receiver 112 faces the outside of the housing 120. The socket connector 111 can be used for connecting to a variety of connectors known to one skilled in the art. For example, one type of known connector may be a Universal Serial Bus (USB).

The lower housing 122 has a through hole 1221 that communicates with the receiver 112 of the socket connector 111 on its lateral side. The through hole 1221 forms an aperture through the lateral side of the lower housing from the inside to the outside of the lower housing 122. A plug connector of an external device may pass through the through hole 1221 of the lower housing 122 and then is fit into the receiver 112 of the socket connector 111 to be electrically connected to socket connector 111 and thus interface with the mobile device.

Also, the lower housing 122 further includes a sealing member 130. The sealing member 130 is fixed to the lower side of the mainboard 110, and defines a space for receiving the socket connector 111 via coupling with the mainboard 110, and is aligned with and adapted to allow the defined space to communicate with the through hole 1221 of the lower housing 122.

As described below, the sealing member 130 forms an open upper portion closely attached to the lower side of the mainboard 110 with an upper leakage prevention member 134 interposed, and an open front portion closely attached to the periphery of the through hole 1221 of the lower housing 122 with a front leakage prevention member 133 interposed, and communicating with the through hole 1221 of the lower housing 122.

The sealing member 130 includes a container-shaped body 131 whose upper portion and front portion are open which forms the body of the sealing member 130, a first connector 135 extending from the lateral side of the body 131, facing upward, and forming a hook 136 at its end, and a second connector 137 extending from another lateral side of the body 131 and forming a boss 138 for providing an attachment point for screw-coupling. The first connector 135 and the second connector 137 of the sealing member 130 are installed to face toward the main board 110 in order to provide strong and secure attachment and fixing between the sealing member 130 and the mainboard 110.

The mainboard 110 includes a hook fasten hole 116 in alignment with and corresponding to and adapted to receive the hook 136 of the first connector 135 of the sealing member 130, and a boss fasten hole 118 in alignment with and corresponding to and adapted to receive a fastener that is secured through the boss 138 of the second connector 137 of the sealing member 130.

The upper housing 121 forms a boss 1216 in alignment with and corresponding to the boss 138 of the sealing member 130 on its lower side.

The hook 136 of the first connector 135 of the sealing member 130 is fit into the hook fasten hole 116 of the mainboard 110 and is hooked onto the mainboard in the approximate location of the hook fasten hole 116, to securely fix the sealing member onto the lower side of the mainboard 110 and so that the sealing member 130 is not detached downward. Also, the boss 1216 of the upper housing 121 passes through the boss fasten hole 118 of the mainboard 110 and screw-couples with the boss 138 of the second connector 137 of the sealing member 130. When the boss 1216 of the upper housing 121 and the boss 138 of the sealing member 130 couple with each other, with a fastening device 142 the mainboard 110 is fixed to the upper housing 121, and the sealing member 130 is closely attached to the mainboard 110, additionally the fastening device 142 passes through the lower housing 122 and couples the upper housing 121, the sealing member 130 and mainboard 110 together thereby securing all the components together to ensure proper positioning of all the components during use. Fastening device 142 may be a screw, or other type of removable threaded fastening device, however one skilled in the art will recognize that the fastening device 142 is not so limited and may include other types of removable fastening devices.

Also, the mainboard 110 further forms a plurality of boss fasten holes 114, and the lower housing 122 forms bosses 1224 corresponding to each of the mainboard 110 boss fasten holes 114. A screw 141 passes through the boss fasten hole 114 of the mainboard 110, couples to the boss 1224 of the lower housing 122, so that the mainboard 110 and the lower housing 122 are closely fixed. This construction plays a role of closely fixing the sealing member 130 between the mainboard 110 and the lower housing 122 by exerting a clamping force between the mainboard 110 and the lower housing 122 to securely clamp the sealing member 130 between the mainboard 110 and the lower housing 122.

Figure 3:
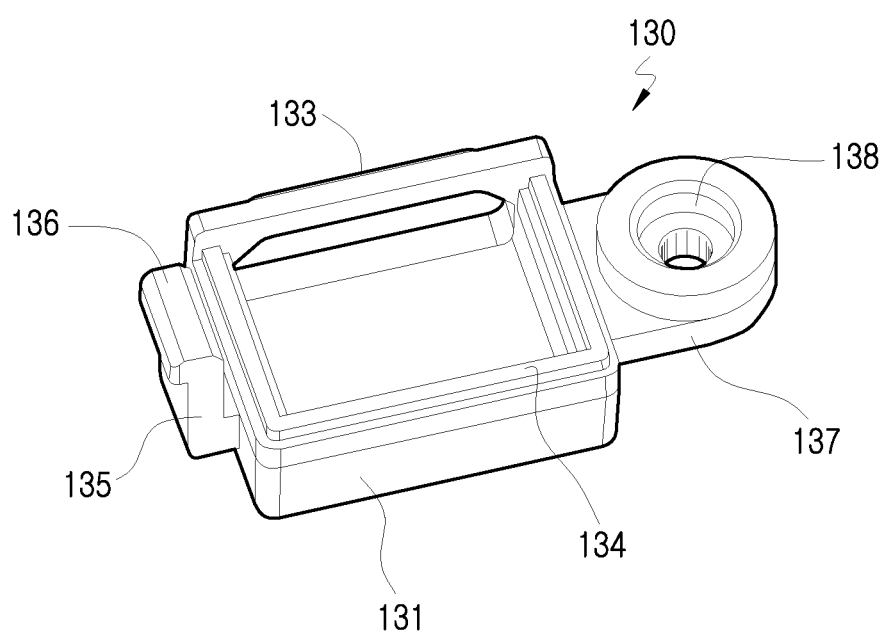
FIG. 3 and FIG. 4 are perspective views illustrating a sealing member according to an exemplary embodiment of the present invention.
Figure 4:
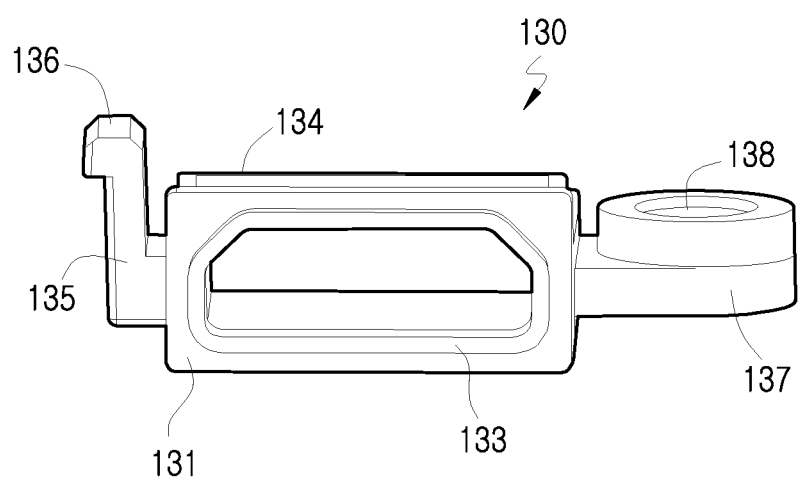

FIGS. 3 and 4 are perspective views illustrating a sealing member according to an embodiment of the present invention.

Referring to FIG. 3, the upper leakage prevention member 134 is disposed on the open upper periphery of the sealing member 130 for contacting and sealing the lower side of the mainboard 110 when installed.

Also, referring to FIG. 4, the front leakage prevention member 133 is disposed on the open front periphery of the sealing member 130 for contacting and sealing the periphery of the through hole 1221 of the lower housing 122 when installed.

The front leakage prevention member 133 and the upper leakage prevention member 134 are formed of a material having resilient and elastic properties, and are interposed between two elements to play a role of sealing the gap between the two elements. The resilient and elastic properties of the leakage prevention members 133 and 134 allows them to readily conform to the shape of the sealing gap between the two elements. Additionally, the elastic and resilient properties allow leakage prevention members to be slightly compressed by the clamping force of the sealing member 130 fastening devices The slight compression together of the leak prevention members together with the ability to conform to the shape of the sealing gap imparts greater waterproofing and sealing capabilities. The sealing member 130 can receive the socket connecter 111 via coupling with the mainboard 110, and defines a space that communicates with the through hole 1221 of the lower housing 122, and seals the prepared space using one or more leakage prevention members 133 and 134.

The front leakage prevention member 133 and the upper leakage prevention member 134 can be formed on the body 131 using double injection molding. For example, the body 131 can be a casting of polycarbonate, and the leakage prevention members 133 and 134 can be a casting of urethane or rubber using double injection molding.

Figure 5:
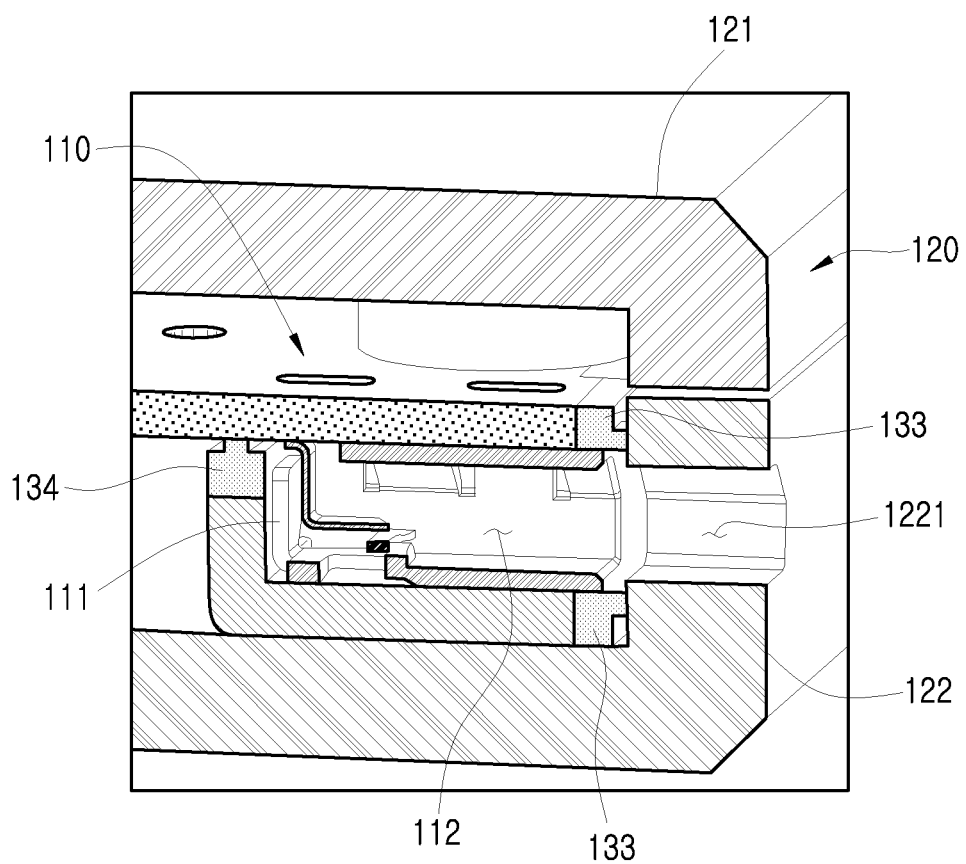
FIG. 5 is a cross-sectional view illustrating an assembled socket connector in an electronic device according to an exemplary embodiment of the present invention.

FIG. 5 is a cross-sectional view illustrating an assembled socket connector in an electronic device according to an embodiment of the present invention.

Referring to FIG. 5, the socket connector 111 is fit in the open upper portion of the sealing member 130 and received in the body 131 of the sealing member 130. Also, the upper leakage prevention member 134 of the sealing member 130 is closely and securely attached to the lower side of the mainboard 110. Furthermore, the front leakage prevention member 133 of the sealing member 130 is closely attached to the periphery of the through hole 1221 of the lower housing 122 when the sealing member 130 is affixed to the mainboard and installed within lower housing 122.

That is, the sealing member 130 receives the socket connector and forms a confined space where the through hole 1221 of the lower housing 122 is open. The leakage prevention members 133 and 134 of the sealing member 130 are installed to the connection portion between the body 131 and the mainboard 110 and the connection portion between the body 131 and the lower housing 122 to prevent leakage of water to the inside of the electronic device.

Consequently, even when water is introduced to the receiver 112 of the socket connector 111 via the through hole 1221 of the lower housing 122, the water does not leak to the inside of the electronic device due to the leakage prevention members 133 and 134 of the sealing member 130.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof

What is claimed is:

1. An electronic device comprising:
  a housing defining an outside surface of the electronic device, wherein the housing comprises a first housing, and a second housing coupled with the first housing and comprising a through hole;
  a Printed Circuit Board (PCB) disposed between the first housing and the second housing;
  a socket connector mounted on a surface of the PCB and disposed between the PCB and the second housing; and
  a sealing member-disposed within the housing,
  wherein the sealing member includes a body of a container shape having an inner space for receiving the socket connector, the body comprising:
    a first opening faced with the surface of the PCB so as to bring the first opening into contact with the surface of the PCB, wherein there is gaplessness between the first opening and the surface of the PCB over all so that the first opening is blocked by the surface of the PCB, and
    a second opening faced with the through hole of the housing so as to bring the second opening into contact with the through hole of the housing, wherein there is gaplessness between the second opening and the through hole of the housing over all, and wherein the first opening is not exposed to an outside of the housing because the first opening is contacted with an inner side surface of the housing,
  wherein the inner space of the sealing member only communicates with an outside of the housing via the through hole of the housing because of the gaplessness between the first opening and the surface of the PCB and the gaplessness between the second opening and the through hole of the housing,
  wherein the sealing member further includes:
    a first extension portion extended from the body and forming a hook at thereof end,
    a second extension portion extended from the body and forming a screw fasten hole, the second extension opposed to the first extension,
  wherein the PCB further includes:
    a first through hole corresponding to and in alignment with the hook of the sealing member,
    a second through hole corresponding to and in alignment with the screw fasten hole,
  wherein the first housing further includes:
    a boss passing through the second through hole of the PCB and extending to the screw fasten hole of the sealing member,
  wherein the hook of the sealing member is hook-coupled with the first through hole of the PCB, and wherein the screw fasten hole of the sealing member is screw-coupled with both the boss of the first housing and the second housing.

2. The electronic device of claim 1, wherein at least one of the first opening and the second opening comprises an elastic material.

3. The electronic device of claim 2, wherein at least one of the first opening and the second opening is formed on the body by double injection molding.

4. The electronic device of claim 1, wherein the socket connector is disposed on a periphery of the PCB.

5. The electronic device of claim 1, wherein the socket connector includes a Universal Serial Bus (USB) connector.

6. The electronic device of claim 1, wherein the sealing member is disposed between the PCB and the housing.

7. The electronic device of claim 1, wherein the PCB is disposed between the first housing and the sealing member, and wherein the sealing member is disposed between the PCB and the second housing.

8. The electronic device of claim 1, wherein the PCB is coupled with housing by a screw.

9. The electronic device of claim 1, wherein at least one of the first opening and the second opening comprises at least one of urethane and rubber.

\* \* \* \* \*